(12) United States Patent
Nagarajan et al.

(10) Patent No.: US 8,519,528 B1
(45) Date of Patent: Aug. 27, 2013

(54) SEMICONDUCTOR STRUCTURE AND METHOD FOR INTERCONNECTION OF INTEGRATED CIRCUITS

(75) Inventors: Kumar Nagarajan, San Jose, CA (US); Raghunandan Chaware, Mountain View, CA (US)

(73) Assignee: Xilinx, Inc., San Jose, CA (US)

( * ) Notice: Subject to any disclaimer, the term of this patent is extended or adjusted under 35 U.S.C. 154(b) by 100 days.

(21) Appl. No.: 13/159,338

(22) Filed: Jun. 13, 2011

(51) Int. Cl.
*H01L 23/04* (2006.01)

(52) U.S. Cl.
USPC .................................. 257/698; 257/E23.067

(58) Field of Classification Search
USPC .................................. 257/698, 700, E23.067
See application file for complete search history.

(56) References Cited

U.S. PATENT DOCUMENTS 8,289,728 B2 * 10/2012 Koide ........................... 361/803

OTHER PUBLICATIONS

U.S. Appl. No. 13/246,728, filed Sep. 27, 2011, CHAWARE, Raghunandan, Xilinx, Inc., 2100 Logic Drive, San Jose, CA US.

* cited by examiner

*Primary Examiner* — Quoc Hoang
(74) *Attorney, Agent, or Firm* — LeRoy D. Maunu

(57) ABSTRACT

In one embodiment, an interposer resistant to warping is provided. The interposer includes a semiconductor body having a first contact array included on a first side of the semiconductor body. Vias are formed through the semiconductor body. One or more wiring layers are included on the first side of the semiconductor body. The wiring layers electrically couple each contact of the first contact array to a respective one of the vias. Contacts of a second contact array, included on a second side of the semiconductor body, are respectively coupled to the vias. A stabilization layer is included on the second side of the semiconductor body. The stabilization layer is configured to counteract stresses exerted on a front side of the interposer due to thermal expansion of wiring layers.

12 Claims, 7 Drawing Sheets

SEMICONDUCTOR STRUCTURE AND METHOD FOR INTERCONNECTION OF INTEGRATED CIRCUITS

FIELD OF THE INVENTION

This disclosure relates generally to semiconductor structures for connecting integrated circuits.

BACKGROUND

There are a number of methods for interconnecting a semiconductor die with other circuits or a package. One approach forms an array of contacts directly on an integrated circuit die. The die is then flipped and aligned with a matching array of contacts formed on a printed circuit board or substrate. Contact arrays typically include a number of "solder balls" or "solder bumps" in a first contact array on the die and a number of self aligning contact pads in a matching contact array on a substrate. Once aligned, the solder bumps are heated to reflow the solder bumps and electrically connect contacts of the first contact array with the contact pad of the matching contact array.

When reflow is complete and the die has been mounted to the substrate, an air gap typically remains between the die and substrate. This gap is commonly filled with material that flows into the gap in liquid form and then solidifies. This material is generally a mixture of an epoxy resin and small silica spheres and is often called underfill. The underfill is typically applied in liquid form from a dispenser at one edge of the die. The underfill then flows into the narrow gap due to capillary action and spreads between the die and the substrate until the gap between the die and substrate has been filled. The underfilling process may also be assisted with vacuum or may be achieved by compression molding. Once hardened, the underfill promotes uniform thermal expansion of the die and substrate, reduces stresses placed on contacts, and seals the contacts and the back side of the die to prevent corrosion.

In many applications, however, it can be difficult to directly connect a die to another circuit or substrate, such as a printed circuit board (PCB). For example, if an integrated circuit is to be mounted on a PCB, wiring of the PCB may be too coarse to connect to the fine contacts of the integrated circuit. In such applications, the die and PCB may be interconnected through an interposer. An interposer is a silicon body having a first set of contacts on one side, to which a die may be bonded, and a second set of contacts on the other side for bonding to another chip, substrate, PCB, etc. Wiring and vias of the interposer may connect fine-pitched die contacts located on one side of the interposer to a coarser contact array on the opposite side of the interposer. An interposer may also provide interconnections between dice that are mounted on the same side of the interposer.

For clarity and ease of reference, a top surface of an interposer, semiconductor die, substrate, or any layer thereof may be referred to as a front side and such terms are used interchangeably herein. Similarly, a bottom surface of an interposer, semiconductor die, substrate, or any layer thereof may be referred to as a back side and such terms are used interchangeably herein.

Through-silicon vias (TSVs) are used to connect the contacts of a first contact array on the front side of the interposer to contacts of a second contact array on the back side of the interposer. However, in forming TSVs in a silicon body of an interposer, the silicon body is often thinned to less than 100 pm. Metalized wiring layers are then added on the front side to connect the TSVs to contacts of the first contact array.

Due to differences in the coefficients of thermal expansion of the silicon body and the metal routing layer, as well as to film stresses generated during silicon layer processing, interposers have a tendency to warp during package assembly. When the interposer is heated to reflow solder joints of a die contact array, wiring in the metal routing layer expands faster than the silicon. As a result, the interposer may curve or warp. Because wiring for routing tends to be more concentrated on the periphery of the interposer, expansion tends to be uneven- further increasing the tendency to warp.

If the warpage of the interposer is not constrained properly, the solder ball connections of the interposer may not form properly during reflow. For example, as one possible consequence of warpage, when the interposer and die are to be bonded with a substrate, one or more solder balls of the interposer contact array may not make contact with the corresponding contact(s) of the substrate. Another possible consequence of warpage is that excess pressure may be placed on one or more solder balls-causing the solder balls to flatten out when reflowed. As a result, adjacent solder balls may contact each other causing a short circuit.

One or more embodiments may address one or more of the above issues.

SUMMARY

In one embodiment, a semiconductor structure is provided. The structure includes a semiconductor body with a first contact array included on a first side of the semiconductor body. A plurality of vias is formed through the semiconductor body. One or more wiring layers are included on the first side of the semiconductor body. The wiring layers electrically couple each contact of the first contact array to a respective one of the plurality of vias. A second contact array is included on a second side of the semiconductor body. Each contact in the second contact array is coupled to a respective one of the plurality of vias. A stabilization layer is included on the second side of the substrate. The stabilization layer is configured to counteract stresses exerted on the front side of the interposer due to thermal expansion of the wiring layers.

In another embodiment, a method of inhibiting warping of an interposer is provided. An interposer is bonded to a carrier. A first contact array of the interposer is aligned with a second contact array of a semiconductor die. The first contact array of the interposer is attached to the second contact array of the semiconductor die. After attaching the first contact array of the interposer to the second contact array of the semiconductor die, the carrier is separated from the interposer.

In yet another embodiment, a method of interconnecting an integrated circuit die and a substrate is provided. A first contact array of an interposer is aligned with a front side contact array of the substrate. Solder balls of the first contact array of the interposer are reflowed to couple the interposer to the substrate. After coupling the interposer to the substrate, a back side contact array of the integrated circuit die is aligned with a second contact array of the interposer. Solder balls of the contact array of the integrated circuit die are reflowed to couple the integrated circuit die to the interposer.

It will be appreciated that various other embodiments are set forth in the Detailed Description and Claims which follow.

BRIEF DESCRIPTION OF THE DRAWINGS

Various aspects and advantages of the disclosed embodiments will become apparent upon review of the following detailed description and upon reference to the drawings in which.

DETAILED DESCRIPTION

One or more embodiments provide various interposer structures and methods for interconnecting a semiconductor die with an interposer that inhibits warping of the interposer during assembly.

In one embodiment, an interposer is implemented with a stabilization layer formed on the back side of the interposer. The stabilization layer is configured to induce thermodynamic expansive stress on the back side of the interposer to counteract stresses exerted on the front side of the interposer due to thermal expansion of wiring layers.

In another embodiment, a method for interconnecting a die and substrate with an interposer is presented. The interposer is first coupled and bonded to a packaging substrate. Afterward, a die is aligned and connected to the front side of the interposer by reflowing solder balls. Because the substrate is bonded to the interposer, the substrate provides support to inhibit warping of the interposer during the reflow process.

Figure 1:
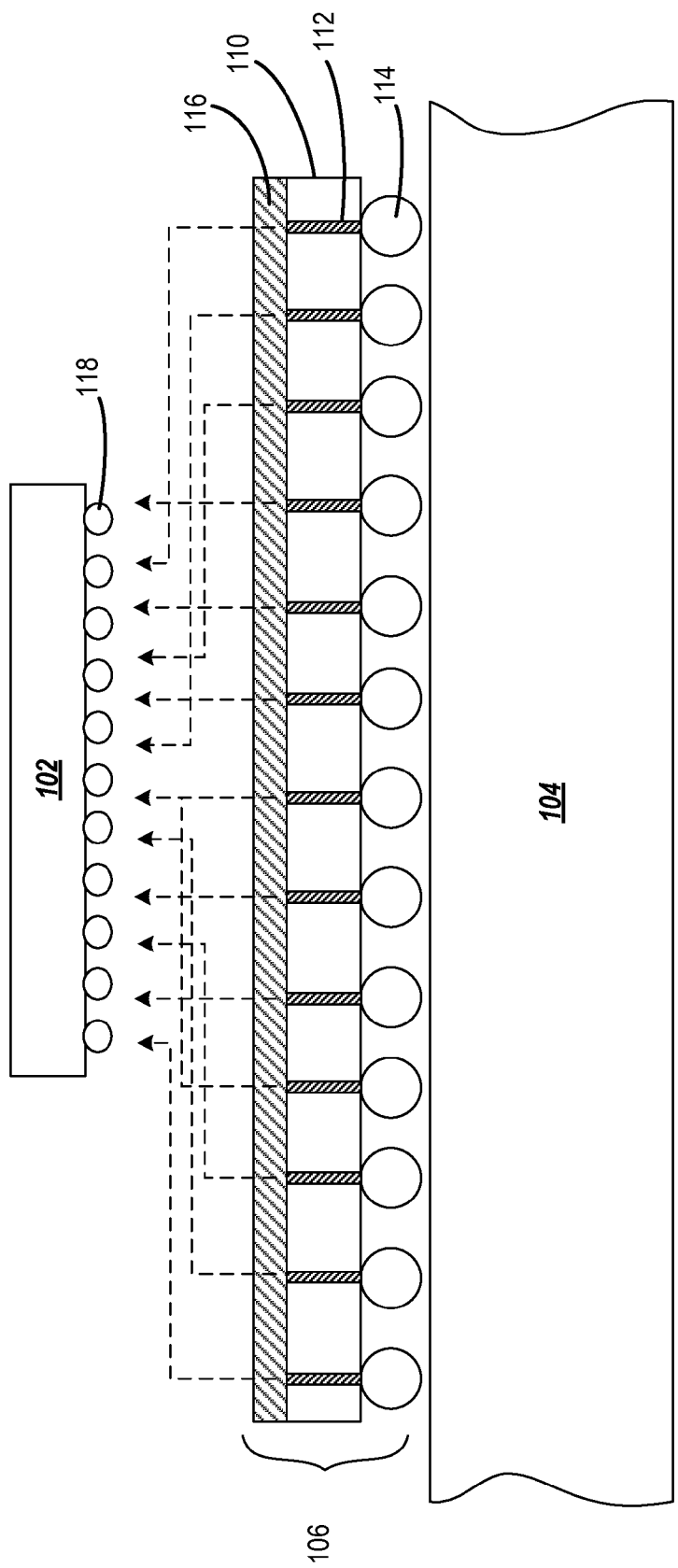
FIG. 1 shows an interposer for interconnecting a semiconductor die with a package substrate.

In yet another embodiment, a rigid carrier frame is affixed to the interposer to provide additional support during reflow and thereby inhibit warping. Interposers may be used for a variety of interconnect applications, including interconnecting a die and a printed wiring board, interconnecting a die and a package substrate, interconnecting stacked dice, etc. For ease of illustration and explanation, the embodiments and examples herein are primarily described with reference to the interconnection of a semiconductor die and a package substrate. FIG. 1 shows an example interposer for interconnecting a semiconductor die and a substrate. The interposer 106 electrically couples contacts of semiconductor die 102 to substrate 104. A semiconductor body such as, e.g., the interposer body 110 is typically formed of silicon. A number of through-silicon vias (TSVs) 112 are formed in the body. A contact array having a plurality of solder ball contacts 114 is formed on a back side of the interposer body 110. The solder ball contacts 114 are coupled to respective ones of the TSVs. One of more wiring layers 116 are formed on the front side of the interposer body 110. The wiring layer(s) implement a plurality of circuit paths which couple the TSVs to respective contact pads of a second contact array (not shown) formed on the front side of the interposer. The second contact array may be aligned and coupled with a contact array 118 formed on the back side of the semiconductor die 102.

Figure 2:
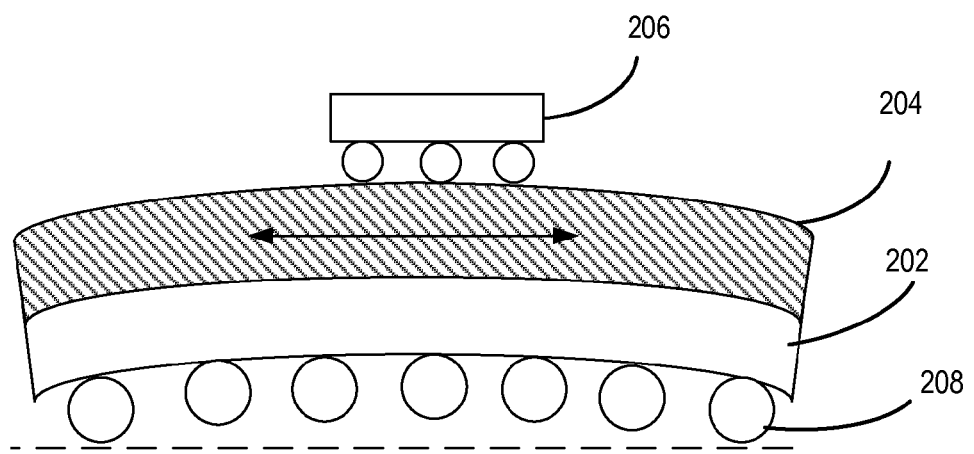
FIG. 2 illustrates warpage of an interposer due to uneven thermodynamic expansion of the silicon body and wiring layer of the interposer.

Due to differences in the rate of thermal expansion of the interposer body 110 and the wiring layer 116, lateral stresses may be induced when solder balls of contact array 118 are heated or reflowed to couple the die 102 to the interposer 106. FIG. 2 illustrates warpage of an interposer due to uneven thermodynamic expansion of the silicon body and wiring layer(s) of the interposer. This example shows an interposer having a silicon body 202 and a metal wiring layer(s) 204 formed on a front side of the silicon body. When solder balls are reflowed to connect the die 206 to the interposer, the metal wiring layer(s) 204 and silicon body 202 are heated. Because the metal wiring has a larger coefficient of thermal expansion than silicon, lateral stress is induced and the interposer warps as a result.

As one possible consequence of the warping, some solder balls of a back side contact array 208 may not make contact with contact pads of a substrate when the die and substrate are aligned. For example, solder balls near the center of the interposer may not contact corresponding contact pads when aligned on a substrate. As another possible consequence, solder balls near the outer edge of the interposer may be flattened. As a result of the flattening, the adjacent solder balls may contact each other, causing a short.

Figure 3:
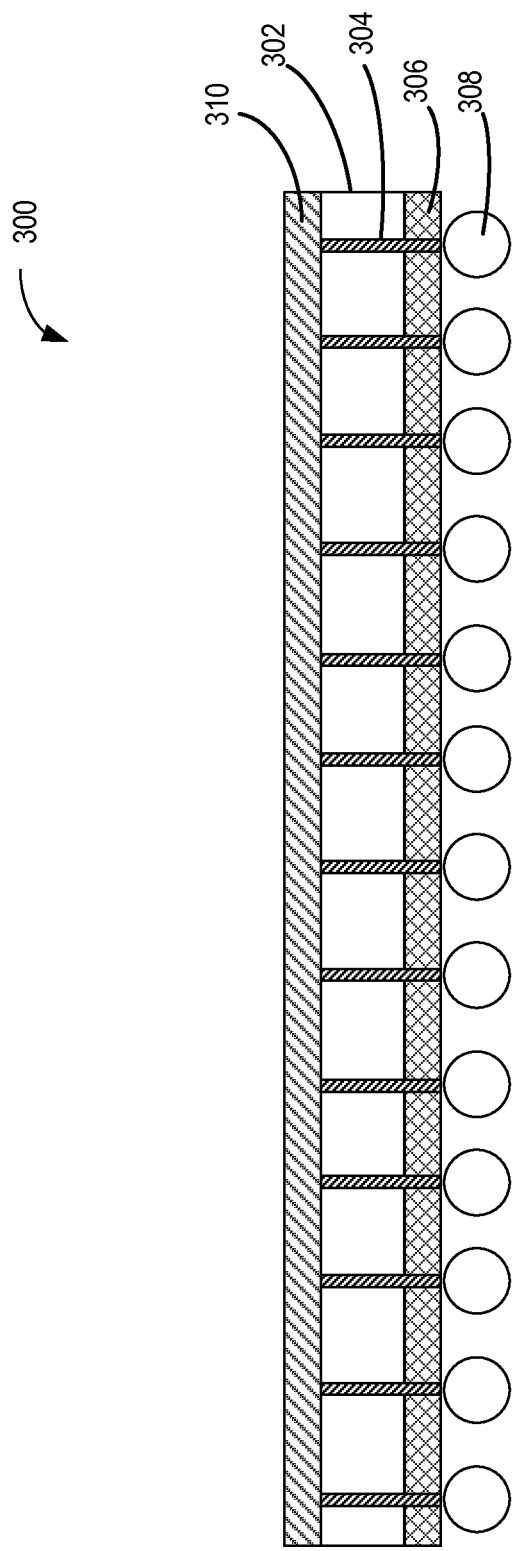
FIG. 3 shows an interposer structure resistant to warping.

One or more embodiments implement an interposer structure having a stabilization layer formed on the back side of the interposer to counter stresses imposed on the interposer by thermal expansion of wiring on the front side of the interposer. FIG. 3 shows an interposer structure resistant to warping. The interposer structure 300 includes an interposer body 302 and a number of TSVs 304 formed in the body. One or more wiring layers 310 are formed on the front side of the interposer body 302. The wiring layer(s) implement a plurality of circuit paths that couple the TSVs to respective contact pads of a second contact array (not shown), which is formed on the front side of the interposer.

To alleviate stresses induced by thermodynamic expansion of wiring on the front side of the body 302, a stabilization layer 306 is formed on the back side of the body 302. An existing stack-up layer such as, e.g., a silicon nitride passivation or dielectric layer can also be used as the stabilization layer 306 by creating a compressive or tensile stress in that layer. The stabilization layer 306 exerts thermal expansion stresses on the back side of the interposer body 302 to counteract all or some of the stresses exerted on the front side of the interposer body 302 due to thermal expansion of the wiring layers 310.

A second contact array having a plurality of solder ball contacts 308 is formed on a back side of the interposer. In this example, the solder ball contacts are formed on the stabilization layer 306. The TSVs 304 extend through the stabilization layer 306 to couple to the solder ball contacts 308.

In some embodiments, the solder ball contact array may be formed directly on the back side of the interposer body 302. In such embodiments, the stabilization layer may be formed between the solder balls of the contact array. One example implementation is shown in FIGS. 4 and 5 below.

The stabilization layer may be formed using any of a number of different materials having different coefficients of thermal expansion, including polyimide, polybenzoxazole (PBO), benzocyclobutene (BCB), copper, aluminum, epoxy molding compound, prepreg material used in build substrate technology or spin-on dielectrics, or dry film materials based on epoxy, or material similar to photoresist. It is recognized that the selected material and thickness of the stabilization layer may depend on coefficient of thermal expansion, amount, and distribution of the wiring material on the front side of the interposer body.

It is recognized that metal wiring in a routing layer of an interposer generally is not evenly distributed, but rather tends to be concentrated near the periphery of the interposer. To counter the stresses imposed by thermal expansion of wiring in the routing layer, stabilization material may be selectively placed on only a portion of the back side of the interposer to more closely approximate distribution of the wiring.

Figure 4:
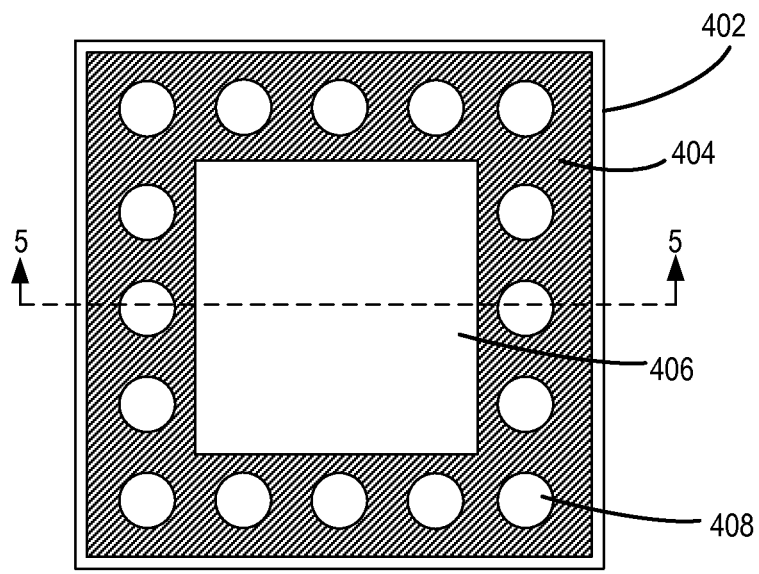
FIG. 4 shows a bottom view of an interposer with selectively placed stabilization layer.
Figure 5:
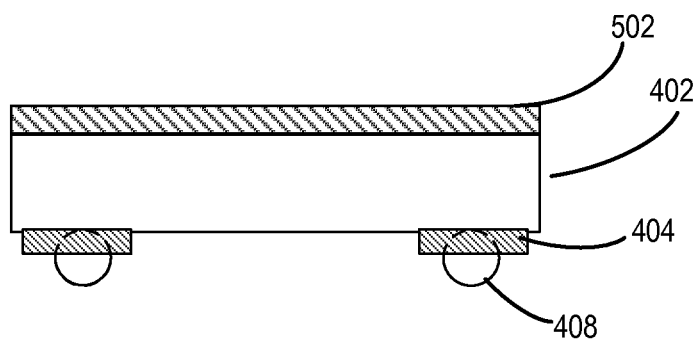
FIG. 5 shows a cross-section in the direction of section line 5 of the interposer depicted in FIG. 4.

FIG. 4 shows a bottom view of an interposer with a selectively placed stabilization layer, and FIG. 5 shows a cross section of the interposer depicted in FIG. 4 taken in the direction of section line 5. In this example, the stabilization layer 404 is formed only in an area along the periphery on the back side of the interposer body 402, leaving the interposer body 402 exposed in a center region 406 of the back side. This placement may be selected to approximate distribution of the wiring 502 on the front side of the interposer body 402. In this example, the stabilization layer is formed around solder balls 408 of the contact array. If a non-conductive material, such as epoxy, is used to form the stabilization layer, the layer may be formed in contact with the solder balls. Otherwise, the stabilization layer may be formed with a gap or insulative material that isolates the solder balls from the stabilization layer.

In some applications, the addition of the stabilization layer may reduce flow of underfill deposited along the edge of the interposer. If the gap between the interposer and the substrate is reduced to an extent that flow of underfill is a concern, thicker contact pads may be used for the contact array on the front side of the substrate to raise the interposer and increase the gap though which underfill may flow.

Figure 6:
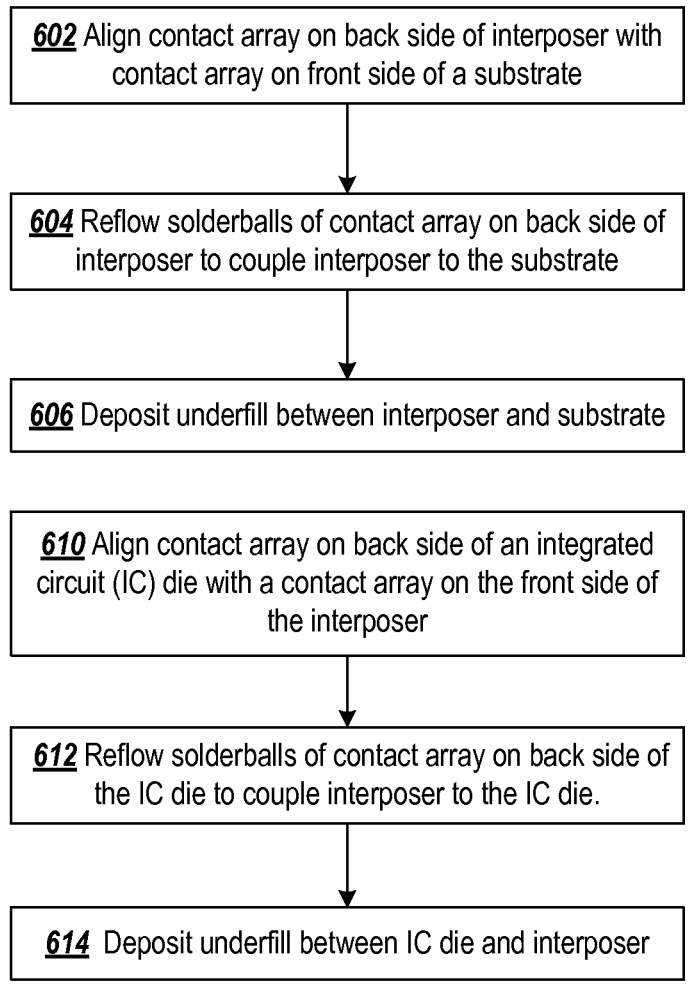
FIG. 6 shows a flowchart of a method for interconnecting an interposer, semiconductor die, and substrate in a manner that inhibits warping of an interposer.

FIG. 6 shows a flowchart of a method for interconnecting an interposer, semiconductor die, and substrate in a manner that inhibits warping of the interposer. A contact array on the back side of the interposer is aligned with a matching contact array on the front side of the substrate at block 602. Solder balls are reflowed at block 604 to electrically couple the aligned contact arrays of the interposer and substrate. Following reflow, underfill is deposited in the gap between the interposer and the substrate at block 606 to securely bond the interposer to the substrate and seal the contact array. A contact array on the back side of an integrated circuit die is aligned with a matching contact array on the front side of the interposer at block 610. Solder balls are reflowed at block 612 to electrically couple the aligned contact arrays of the die and the interposer. Because the substrate is bonded to the interposer, the substrate provides support to inhibit warping of the interposer during the reflow process performed at block 612. Underfill is deposited in a gap between the die and the interposer at block 614.

In the above description, solder balls of the contact array of the IC die are reflowed prior to depositing underfill between the interposer and substrate. It is recognized that other underfill methods may be applied as well. For example, underfill may be deposited first and cured during the reflow of solder balls of the IC die.

Figure 7:
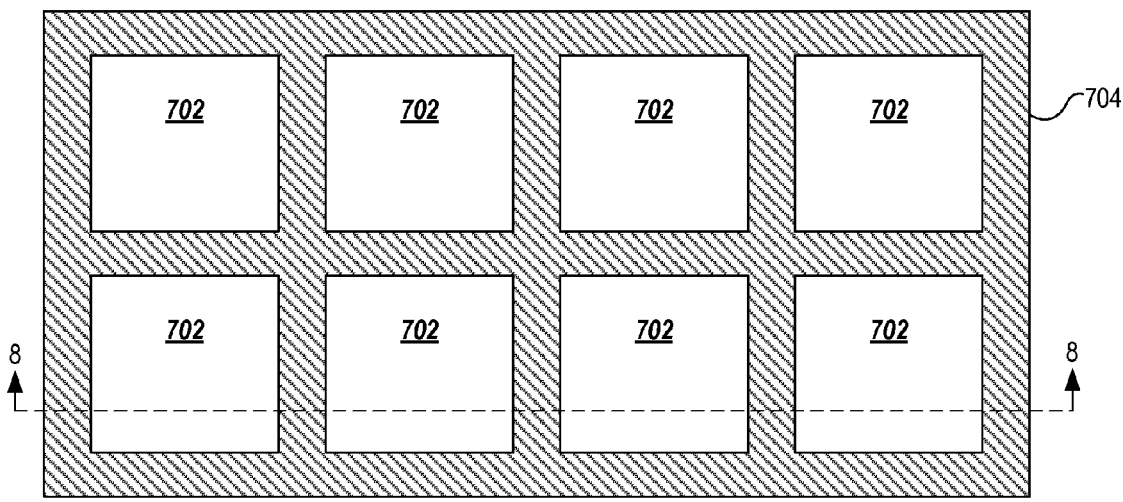
FIG. 7 shows a plurality of interposers bonded to a sacrificial carrier frame that is configured to inhibit warping of the interposers during solder ball reflow.
Figure 8:
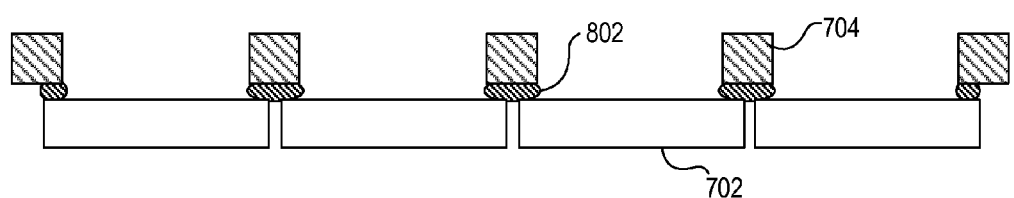
FIG. 8 shows a cross-section of the interposers and carrier frame taken in the direction of section line 8 as illustrated in FIG. 7.

FIGS. 7 and 8 show a plurality of interposers bonded to a carrier frame for inhibiting warping of the interposers during solder ball reflow. FIG. 7 shows a top view of the interposers and carrier frame, and FIG. 8 shows a cross section of the interposers and carrier frame shown in FIG. 7 taken in the direction of section line 8. A plurality of interposers 702 is bonded to a carrier frame 704 with an adhesive 802. The carrier frame is formed of a material, such that when the solder balls of the interposers are heated to reflow temperatures, the carrier frame exhibits a rigidity that is sufficient to inhibit warping of the interposers 702. Some suitable carrier frame materials include: aluminum, tungsten, epoxy, quartz, glass, silicon, silicone and silicone-based rubbers, fiberglass-reinforced epoxy, pregrep, or laminates, etc. After bonding the dice to the respective interposers, the carrier frame may be separated from the interposers.

In some embodiments, a separate carrier frame may be used for each individual interposer. In such embodiments, the carrier frame may remain affixed to the interposer to provide further support during processing, moving the interposer between processing locations, shipping, and/or use. In one implementation, a carrier frame may be separated from an interposer following bonding of an IC die to the interposer. In another implementation, the carrier frame may remain attached to the interposer to further inhibit warping during the reflow for coupling the interposer and the substrate. After bonding the interposer and substrate, the carrier frame may be removed. In another embodiment, the carrier frame may never be removed from the interposer. In embodiments where the carrier frame remains attached to the interposer, the carrier frame may be configured to serve other purposes, such as serving as a heat sink.

It is envisioned that in some manufacturing flows, an interconnected die and interposer may be shipped to another entity for further downstream processing. In such manufacturing flows, the interposer and die may be shipped with the carrier frame attached in order to provide support during shipping or further downstream processing.

In embodiments that separate the interposer and carrier frame, the carrier frame may be removed in a number of different ways. In one example embodiment, solvent may be used to dissolve the adhesive 802. In another embodiment, all or a portion of the carrier frame may be removed by cutting the frame. For example, referring to the carrier frame depicted in FIG. 7, the interposers 702 may be singulated by cutting the carrier frame after interconnecting respective dice on the interposers. It is recognized that the method of removal may vary depending on the application, type of adhesive, material forming the carrier frame, etc.

Figure 9:
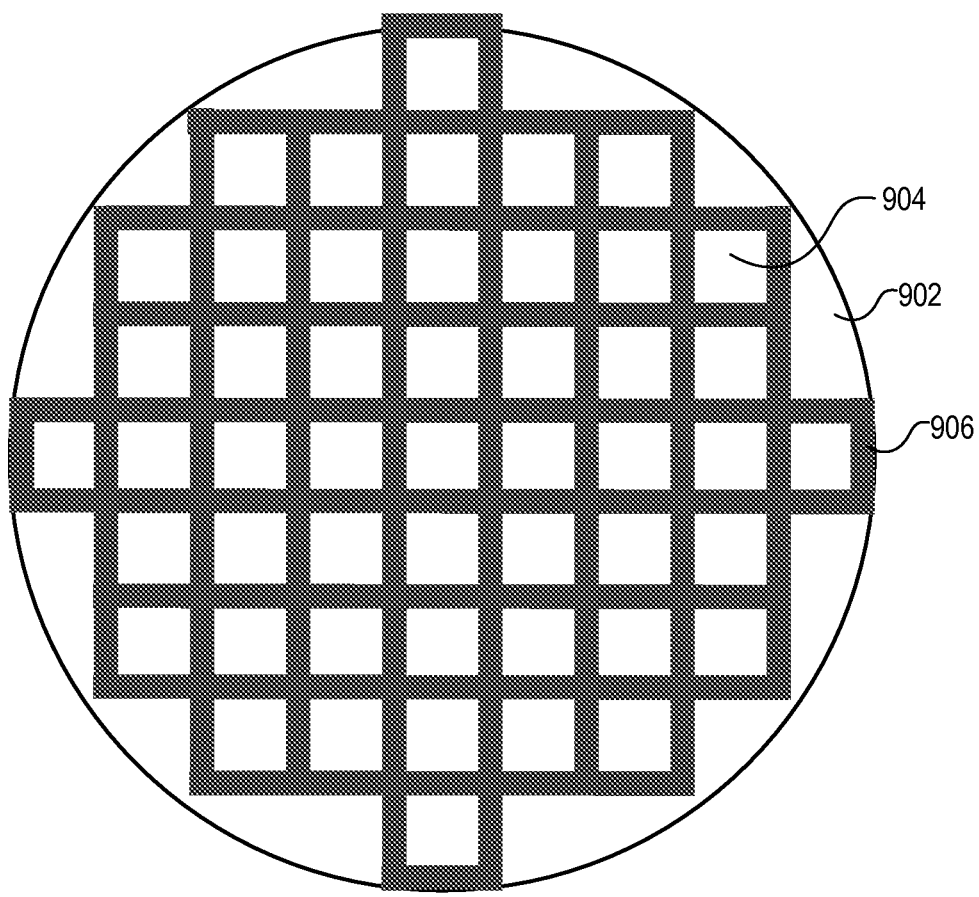
FIG. 9 shows a carrier frame configured to inhibit warping of an entire wafer of interposer dice.

It is recognized that the carrier frame may be formed in a number of different shapes. For example, FIG. 9 shows a carrier frame 906 configured to inhibit warping of an entire wafer 902 of interposer dice 904. In some manufacturing flows, the carrier frame 906 may be bonded to the wafer 902 prior to singulating the interposer dice 904 or may allow singulated interposer dice to be further processed using flows and tools configured for processing of wafers. Other carrier frame shapes are envisioned as well.

The examples described herein generally have each contact of a contact array on a front side of the interposer connected to a respective contact of a contact array on the back side of the interposer. However, it is recognized that for some applications, not all die contacts are connected to a respective contact on the back side of the interposer. For example, multiple die contacts may be connected to the same interposer contact.

While embodiments may have been described in connection with a specific application, variations of these embodiments will be obvious to those of ordinary skill in the art. For example, the embodiments may be utilized in various combinations to further inhibit warping of an interposer during assembly. Therefore, the scope of the appended claims should not be limited to the foregoing description.

What is claimed is:

1. A semiconductor structure, comprising:
   a semiconductor body;
   a first contact array formed on a first side of the semiconductor body;
   a plurality of vias formed through the semiconductor body;

one or more wiring layers formed on the first side of the semiconductor body and electrically coupling each contact of the first contact array to a respective one of the plurality of vias;

a second contact array formed on a second side of the semiconductor body, each contact in the second contact array coupled to a respective one of the plurality of vias; and a stabilization layer formed on the second side of the semiconductor body, the stabilization layer configured to counteract stresses that are exerted on the front side of an interposer and that result from thermal expansion of wiring layers;

wherein the stabilization layer has a coefficient of thermal expansion greater than a coefficient of thermal expansion of the semiconductor body.

2. The structure of claim 1, wherein the stabilization layer is configured to counteract stresses exerted on the front side of the interposer resulting from thermal expansion of wiring layers by inducing thermodynamic expansive stress on the back side of the interposer.

3. The structure of claim 1, wherein the one or more wiring layers have respective coefficients of thermal expansion greater than a coefficient of thermal expansion of the semiconductor body.

4. The structure of claim 1, wherein a coefficient of thermal expansion of the stabilization layer is sufficient to inhibit warping of the interposer during reflow of solder balls of either the first or second contact arrays.

5. The structure of claim 1, wherein the stabilization layer and second contact array are formed in one plane.

6. The structure of claim 1, wherein
the stabilization layer is formed in a plane between the second contact array and the semiconductor body; and
the plurality of vias are formed through the stabilization layer.

7. The structure of claim 1, wherein the first contact array includes contact pads and the second contact array includes solder balls.

8. The structure of claim 1, wherein the stabilization layer is a metallic layer.

9. The structure of claim 1, wherein the stabilization layer includes a molding compound.

10. The structure of claim 1, wherein the stabilization layer is formed only on a perimeter portion of the second side of the semiconductor body.

11. The structure of claim 1, wherein the stabilization layer is a patterned layer.

12. The structure of claim 1, further comprising a carrier frame attached to the semiconductor body, the carrier frame having a rigidity sufficient to inhibit warping of the interposer during reflow of solder balls of either the first or second contact arrays.

* * * * *